United States Patent
Ahmad et al.

(10) Patent No.: US 9,683,132 B2
(45) Date of Patent: Jun. 20, 2017

(54) PROCESS FOR PROTECTING AN ELECTRONIC DEVICE BY SELECTIVE DEPOSITION OF POLYMER COATINGS

(71) Applicants: Syed Taymur Ahmad, Chicago, IL (US); Bruce Acton, Bettendorf, IA (US)

(72) Inventors: Syed Taymur Ahmad, Chicago, IL (US); Bruce Acton, Bettendorf, IA (US)

(73) Assignee: Advanced Consulting Technologies, Inc., Chicago, IL (US)

( * ) Notice: Subject to any disclaimer, the term of this patent is extended or adjusted under 35 U.S.C. 154(b) by 0 days.

(21) Appl. No.: 15/261,624

(22) Filed: Sep. 9, 2016

(65) Prior Publication Data

US 2017/0073546 A1 Mar. 16, 2017

Related U.S. Application Data

(60) Provisional application No. 62/217,416, filed on Sep. 11, 2015.

(51) Int. Cl.
*H05K 1/00* (2006.01)
*C09D 183/04* (2006.01)
(Continued)

(52) U.S. Cl.
CPC .......... *C09D 183/04* (2013.01); *C09D 133/16* (2013.01); *H05K 1/0353* (2013.01);
(Continued)

(58) Field of Classification Search
CPC .......... H05K 3/28; H05K 3/282; H05K 3/285; H05K 3/40; H05K 3/46; H05K 3/462;
(Continued)

(56) References Cited

U.S. PATENT DOCUMENTS 5,972,807 A * 10/1999 Tani ................. H05K 3/4676
442/164
6,280,851 B1 * 8/2001 Pasternack ............... B32B 7/06
361/750
(Continued)

FOREIGN PATENT DOCUMENTS

EP 1 779 421 A0 2/2006
EP 1 926 355 A2 5/2008
(Continued)

OTHER PUBLICATIONS

International Search Report of PCT/US2016/050935 issued from European Patent Office and mailed Jan. 9, 2017.

*Primary Examiner* — Duc M Nguyen
(74) *Attorney, Agent, or Firm* — Finnegan, Henderson, Farabow, Garrett & Dunner, LLP

(57) ABSTRACT

Methods for protecting an electronic device from contaminants by applying different polymeric materials to different vital components of a device are disclosed. In one embodiment, the method comprises applying a first polymer, such as an acrylic-based polymer, to one or more connectors and components located on the printed circuit board of the device. The method further comprises applying a second polymer, such as a silicone-based polymer, to different connectors and components on the printed circuit board. The method leads to different components being coated with a different polymers, without the need for multilayer coatings on any component. Electronic devices that are protected by such polymeric, hydrophobic coatings are also disclosed. Non-limiting examples of such devices include smart phones, computers, and gaming devices.

32 Claims, 2 Drawing Sheets

(51) Int. Cl.
*H05K 3/28* (2006.01)
*H05K 7/14* (2006.01)
*H05K 1/03* (2006.01)
*C09D 133/16* (2006.01)
*H01R 12/71* (2011.01)
*H05K 3/40* (2006.01)

(52) U.S. Cl.
CPC ............. *H05K 3/282* (2013.01); *H05K 3/285* (2013.01); *H05K 7/1427* (2013.01); *H01R 12/716* (2013.01); *H05K 3/40* (2013.01); *H05K 2201/0162* (2013.01)

(58) Field of Classification Search
CPC ......... H05K 3/4623; H05K 2201/0162; H05K 2201/04; C09D 183/04; C09D 133/16; H01R 12/7082; H01R 12/716
USPC .......................................... 361/748, 751, 765
See application file for complete search history.

(56) References Cited

U.S. PATENT DOCUMENTS

| | | | |
|---|---|---|---|
| 7,731,517 B2 * | 6/2010 | Lee | H01R 12/592 439/271 |
| 2001/0034164 A1 * | 10/2001 | Crane, Jr. | H01R 13/05 439/660 |
| 2002/0146573 A1 * | 10/2002 | Shimada | C08L 43/04 428/447 |
| 2004/0203281 A1 * | 10/2004 | Crane, Jr. | H01R 12/7047 439/569 |
| 2008/0236876 A1 * | 10/2008 | Kodama | G02B 6/43 174/260 |
| 2009/0314538 A1 | 12/2009 | Jomaa et al. | |
| 2010/0148910 A1 | 6/2010 | Takada | |
| 2010/0176517 A1 | 7/2010 | Miyagawa et al. | |
| 2012/0077353 A1 * | 3/2012 | Shedletsky | H01R 13/7197 439/55 |
| 2015/0370748 A1 * | 12/2015 | Wakayama | G06F 13/4022 710/106 |
| 2016/0200842 A1 * | 7/2016 | Furuta | C08F 299/08 526/227 |
| 2016/0204535 A1 * | 7/2016 | Ye | H01R 9/2658 439/66 |
| 2016/0355691 A1 * | 12/2016 | Kim | C09D 5/08 |

FOREIGN PATENT DOCUMENTS

EP  2 793 538 A1  10/2014
WO  WO 2007/049417 A1  3/2007

* cited by examiner

PROCESS FOR PROTECTING AN ELECTRONIC DEVICE BY SELECTIVE DEPOSITION OF POLYMER COATINGS

This application claims priority to U.S. Provisional Application No. 62/217,416, filed on Sep. 11, 2015, which is incorporated herein by reference in its entirety.

The present disclosure generally relates to methods of protecting electronic devices, such as a cell phone or computer, by applying different polymer materials to different individual device components that render the resulting device hydrophobic. The present disclosure also relates to devices protected by such polymeric coatings, including any device containing a printed circuit board.

BACKGROUND

Electronic devices are comprised of electrically conductive and insulating components, which can be adversely affected by a variety of contaminants. Exposure to liquids like water, will often lead to corrosion of these components that will eventually destroy the function of the electronic device. In addition, as such devices become more sophisticated with increased functionality, they are being used in more hazardous environments that require greater protection from contaminants, especially liquids.

As a result, water resistant coatings are becoming a more popular form of protection of such devices. However, most water resistance technologies provide only one form of nano-coating (one molecule) and one method of application. Accordingly, there is need for coated electronic devices and methods that allow for protection of electronic devices from contaminates, that comprises multiple coatings or different chemistries, as well as multiple methods for applying such coatings.

SUMMARY

In view of the foregoing, there is disclosed a method for protecting an electronic device by applying different polymeric materials on the vital components of the device. In one embodiment, the disclosed method generally comprises treating, in any order, the backside and front side of the printed circuit board. In one embodiment, treating the backside of the circuit board comprises: applying a first polymer around the parameter of at least one female connector, to the surface of at least one internal component, or combinations thereof; curing said first polymer; applying a second polymer to at least one internal component. In one embodiment, treating the front side of the circuit board comprises: applying the first polymer around the parameter of at least one female connector, around the perimeter of one or more connected cameras, to the surface of at least one internal component, or combinations thereof; curing the first polymer; applying the second polymer to at least one internal component.

The method next comprises assembling the electronic device by installing the printed circuit board and battery in a housing; connecting the male connectors of the device to base female connectors mounted on the back side of the printed circuit board; and applying the first polymer to the side of the connector in an amount sufficient to achieve wicking coverage around perimeter.

The first polymer described herein has a hardness greater than the second polymer. For example, in one embodiment the first polymer comprises an acrylic-based polymer. Such a polymer can be fully cured when exposed to ambient conditions for 24 hours. In one embodiment, the second polymer comprises a silicone-based polymer. Such a polymer can be cured when exposed to ambient conditions for up to 30 minutes.

In one embodiment, there is disclosed an electronic device protected from contaminants by the treatment method described herein. For example, there is described a printed circuit board having a front side and a back side, the backside comprising: at least one female connector having a first polymer located around the perimeter; at least one internal component having the first polymer located thereon; and at least one different internal component having a second polymer located thereon.

In an embodiment, the front side of the printed circuit board comprises at least one female connector having the first polymer located around the perimeter; at least one camera having the first polymer located around the perimeter; at least one internal component having the first polymer located thereon; and at least one different internal component having a second polymer located thereon. The assembled electronic device further comprises the first polymer being placed around perimeter of the housing.

It is to be understood that both the foregoing general description and the following detailed description are exemplary and explanatory only and are not restrictive of the invention, as claimed.

BRIEF DESCRIPTION OF THE DRAWINGS

The accompanying figures, which are incorporated in and constitute a part of this specification, illustrate several embodiments of the invention and together with the description, serve to explain the principles of the invention.

DETAILED DESCRIPTION

As used herein, "ambient conditions" refers to 72° F. and 45% humidity.

As used herein, "inert to conductivity" means that the material does not conduct or resist electrical charge.

As used herein, "water contact angle" is measured using droplets of water that are placed onto a 304 stainless steel surface that has been treated with the described polymer(s). For example, the first polymer having a water contact angle greater than 90 degrees after curing means that a 304 stainless steel surface has been coated with the first polymer, which is then cured prior to a droplet of water being dropped thereon. The same is true for the water contact angle for the second polymer.

Other contact angles were also used to determine the hydrophobic properties of the described coatings placed on different substrates. For example, water contact angles and oil contact angles are described herein that were measured on treated glass slides and treated aluminum substrates. The methods used to measure these contact angles are similar to those described for the treated 304 stainless steel surface.

To protect an electronic device from contaminants, such as water, there is disclosed a method of applying to at least one component of a device, different polymers to different connections and components located on the printed circuit board.

Figure 1:
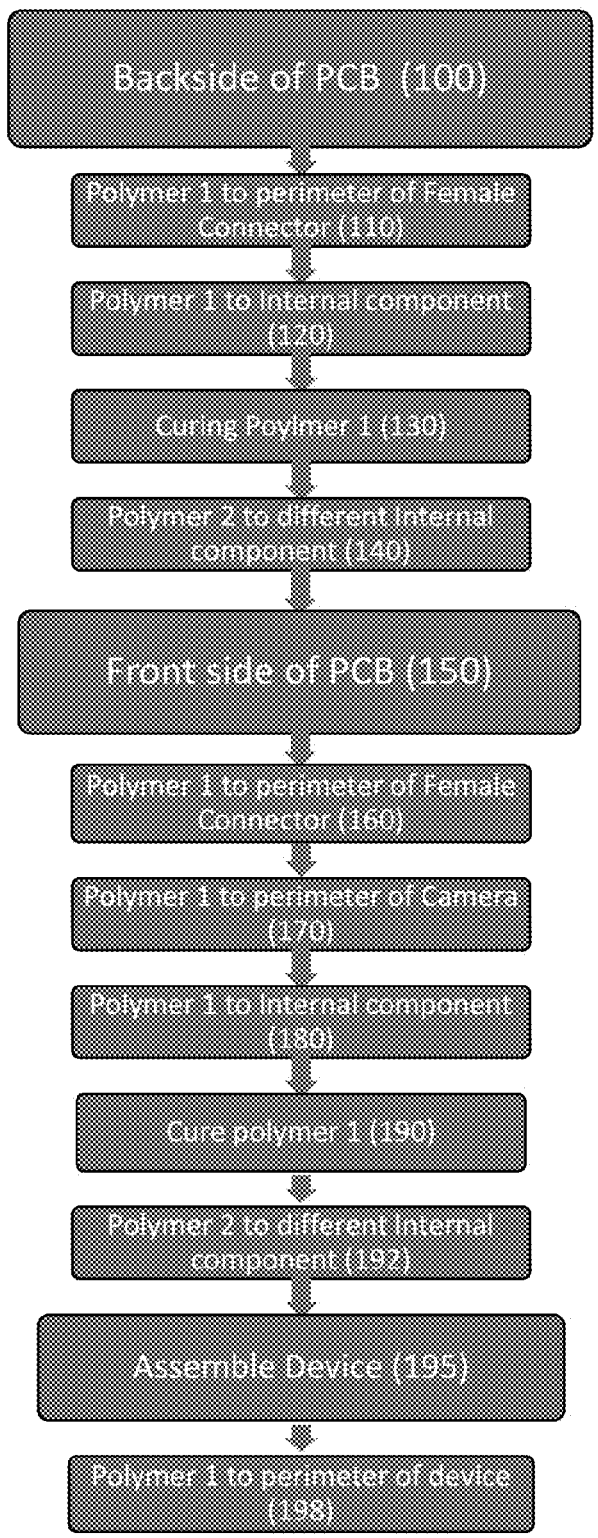
FIG. 1 is a flow chart showing the general method used to treat a printed circuit board according to an embodiment.

Referring now to the FIG. 1 which depicts a flow diagram of an embodiment of the present disclosure, specifically the general process of protecting an electronic device that comprises a printed circuit board 100.

As described in FIG. 1, the method comprises applying a first polymer to one or more connectors 110 and components 120 located on the backside of a printed circuit board 100. The method then comprises curing the first polymer 130, before applying a second polymer to different components 140 on the backside of the PCB. Both the first polymer and the second polymer provide layers that exhibit hydrophobic properties, as determined by a water contact angle greater than 90 degrees such at least 110°, such as 115° or greater, or any contact angle ranging from 100 to 120°.

Treating the front side of the circuit board 150 comprises applying the first polymer around the parameter of at least one female connector 160, around the perimeter of one or more connected cameras 170, to the surface of at least one internal component 180, or combinations thereof. Next, the first polymer is cured 190, prior to applying the second polymer to at least one internal component 192.

As further described in the flow chart of FIG. 1, the method next comprises assembling the electronic device 195. Assembling the electronic device includes installing the printed circuit board and battery in the appropriate housing and connecting the male connectors of the device to base female connectors mounted on the back side of the printed circuit board. Finally, the first polymer is applied to the side of the connector in an amount sufficient to achieve wicking coverage around perimeter 198.

In one embodiment, the first polymer has a higher hardness than the second polymer. For example, the first polymer may comprise an acrylic-based polymer, such as a fluoroacrylate. One non-limiting example of a fluorinated acrylic that can be used herein is shown in (I) below:

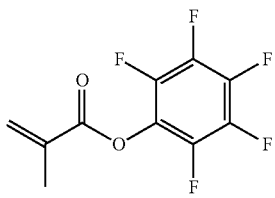

(I)

Upon curing, a coating comprising the acrylic-based polymer provides a hard barrier that exhibits excellent insulating and anti-corrosion properties. Curing of the fluorinated, acrylic-based polymer typically comprises exposing the polymer to ambient conditions for at least 24 hours. This may be done under thermal conditions, for times less than 24 hours. Curing is done at a temperature and for a time sufficient to cure the polymer material. In one embodiment, first polymer is applied to the connector(s) and/or components in a single layer. In one embodiment, the thickness of the silicone-based polymer layer ranges from 20 to 1000 nm.

In one embodiment, the second polymer comprises a silicone-based polymer. One non-limiting example of a silicone-based polymer that can be used herein is aliphatic siloxane, as shown in (II) below:

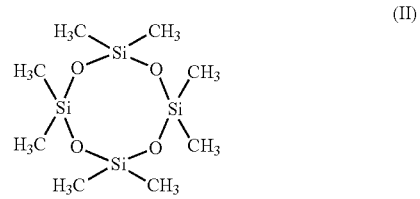

(II)

Upon curing, a coating comprising the silicon-based polymer provides a improved surface properties, including improved hydrophobicity, improved oleophobicity and reduced friction. The coated surface also exhibits anti corrosion properties. Curing of the silicone-based polymer typically comprises exposing the polymer to ambient conditions for at least 30 minutes. Alternatively, curing may be done under thermal conditions, such as heating above 80° C., such as from 90-110° C. for a time sufficient to cure the polymer. Such times range are typically up to 5 minutes, but may range from 2 to 10 minutes depending on the polymer composition and layer thickness. In one embodiment, the thickness of the silicone-based polymer layer ranges from 50 to 500 nm.

The silicone-based polymer may further comprises at least one hydrophobic agent, such as an organometallic compound. In one embodiment, the organometallic halogen material comprises at least one alkyl group and at least one halogen atom linked to a metal atom. Non-limiting examples of the metal atom include titanium, zirconium, tantalum, germanium, boron, strontium, iron, praseodymium, erbium, cerium, lithium, magnesium, aluminum, phosphorus and silicon.

In one embodiment, the first and second polymers are applied by at least one automated or manual deposition technique chosen from dipping, spraying, vacuum deposition, and wipe coating. Additional steps may be carried out before or after applying the polymers. For example, in one embodiment, the method may further comprise cleaning the electronic component prior to applying either polymer material to remove dust, grime or other surface dirt.

Non-limiting examples of the electronic component that may be coated using the disclosed method include a power switch, a volume switch, a light, a liquid crystal display, a touch-screen, a touch panel, a camera, an antenna, an internal connector, such as a printed circuit board, and combinations thereof.

It is understood that when the internal connector has a male end and a female end, the method comprises applying the polymers to both the male end and the female end of the connector prior to connecting the male end to the female end.

There is also disclosed an electronic device that is protected from contaminants, such as water, because it comprises a hydrophobic polymers on at least one connector and/or one internal component. Non-limiting examples of at least one or more devices that can be protected using the disclosed method include a cellular phone, a personal digital assistant (PDA), a tablet, a notebook, a laptop, a desktop computer, a music player, a camera, a video recorder, a battery, an electronic reader, a radio device, a gaming device, a server, headphones, terminal blocks, and control panels. In addition, other devices that can be protected using the disclosed method include a wearable device, a medical device, a radio controlled device, an industrial device, an appliance device.

As discussed, both the first polymer and the second polymer exhibit hydrophobic properties, as determined by a water contact angle greater than 90 degrees such that the first layer and second layer form a multilayer, hydrophobic coating on top of the internal component. In one embodiment, the first and second polymers have a water contact angle of at least 110°, such as 115° or greater, or any contact angle ranging from 100 to 120°.

It has been discovered that electronic devices that have been protected as described herein, have increased water resistance by at least one order of magnitude, as measured by the time to malfunction when immersed in water. In particular, the Inventors have discovered that by providing the multilayer, hydrophobic coating as a barrier layer on the vital, and highly susceptible parts of an electronic device, water resistance of the device can increase at least 10 times, such as more than 25 times, or even more than 50 times when compared to an unprotected device. Furthermore, because the multilayer, hydrophobic coating described herein is inert to conductivity, it does not interfere with the function of the resulting electronic device, while adding the improved water resistance.

Low surface tension of the coating solution as disclosed herein provides increased surface wetting, especially under low profile components. The polymers described herein also provides excellent repellency, anti-wetting and anti-sticking properties against fluids, including but not limited to water, hydrocarbons, silicones and photoresists. As a result, the dried film has low surface energy allowing water-based liquids to bead and drain freely.

In addition the polymers described herein, when applied as coatings, polymeric film is insoluble in solvents such heptane, toluene and water. An additional benefit associated with the polymers described herein in their flexibility. As these layers do not require thermal treatment, or harsh chemicals, they can be applied to many different substrates, including glass, metals, such as aluminum, stainless, and polymers.

The features and advantages of the present invention are more fully shown by the following examples which are provided for purposes of illustration, and are not to be construed as limiting the invention in any way.

EXAMPLE

The following example provides a step-by-step process of protecting a smart phone from contaminants by applying two different polymers to different components of the smart phone prior to final assembly of the device.

Figure 2:
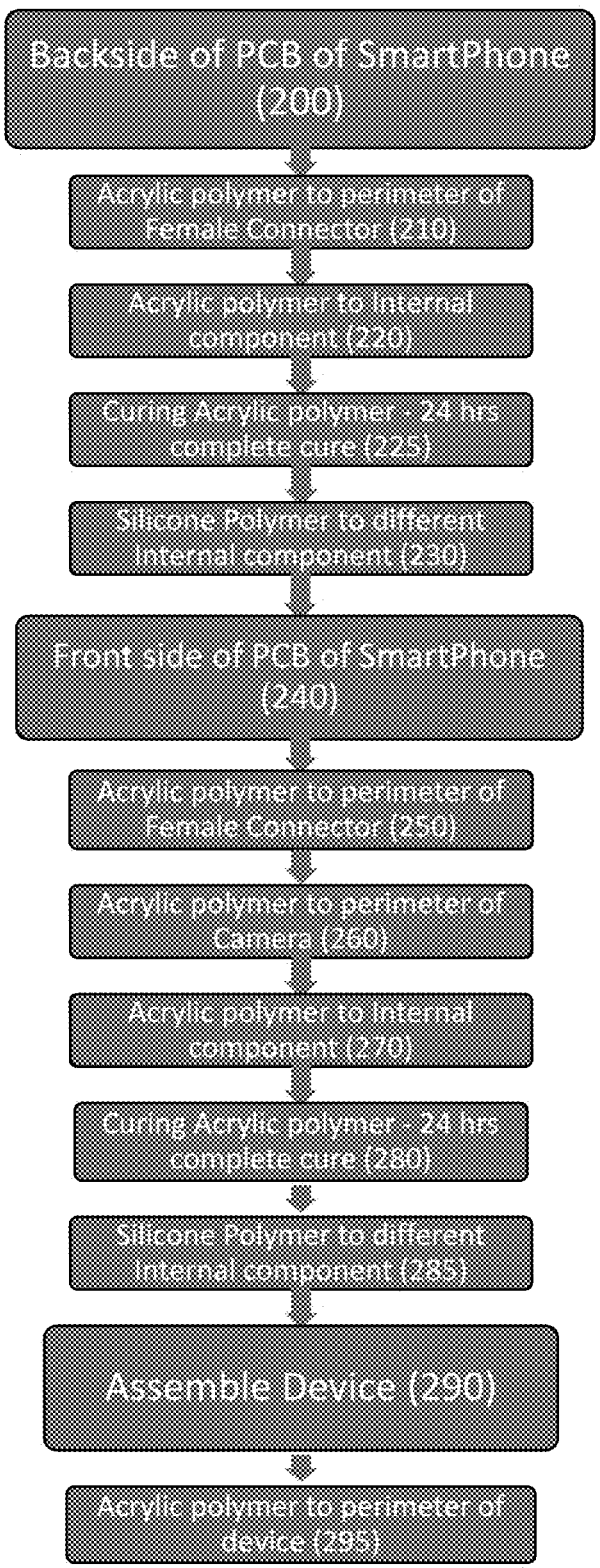
FIG. 2 is a flow chart showing a more specific method used to treat a printed circuit board with an acrylic-based polymer and a silicone based polymer according to an embodiment.

The process is described in FIG. 2, which is referred to herein, and started on a disassembled smart phone. The backside of the printed circuit board 200 was first treated. A fluorinated acrylic polymer was applied around the perimeter of a flexible printed circuit (FPC) based female connector 210. This same polymer was then applied to various internal components 220 located on the backside of the PCB 200.

The a fluorinated acrylic polymer was cured by exposing it to ambient conditions for 24 hours 225. After it was completely cured, an aliphatic siloxane was applied on various internal components 230 located on the backside of the PCB 200.

Next, the front side of the circuit board 240 was treated. This method comprised applying the fluorinated acrylic polymer around the perimeter of the flexible printed circuit (FPC) based female connector 250. In subsequent steps, the a fluorinated acrylic was then applied around the perimeter of the connected camera 260 and various internal components 270 located on the front side of the circuit board 240.

The fluorinated acrylic polymer was cured by exposing it to ambient conditions for 24 hours 280. After it was completely cured, the aliphatic siloxane was applied on various internal components 285 located on the front side of the PCB 240.

The method next comprises assembling the electronic device 290. Assembling the electronic device includes installing the printed circuit board and battery in the appropriate housing and connecting the male connectors of the device to base female connectors mounted on the back side of the printed circuit board. Finally, the fluorinated acrylic polymer was applied the side of each connector until full wicking around the perimeter occurred 295.

The smart phone protected by the process of this Example was then tested to determine the efficacy of the inventive process. It was discovered that a smart-phone device protected with the different polymers as described above exhibited at least one order of magnitude longer protection time when compared to the same device not protected with the disclosed polymers.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present disclosure.

Other embodiments of the invention will be apparent to those skilled in the art from consideration of the specification and practice of the invention disclosed herein. It is intended that the specification and examples be considered as exemplary only, with the true scope of the invention being indicated by the following claims.

What is claimed is:

1. A method of protecting an electronic device having a printed circuit board, said method comprising: treating, in any order, the backside and front side of the printed circuit board, wherein said treating the backside of the circuit board comprises:
    applying a first polymer around the perimeter of at least one female connector, to the surface of at least one internal component, or combinations thereof;
    curing said first polymer;
    applying a second polymer to at least one internal component, wherein said treating the front side of the printed circuit board comprises:
    applying the first polymer around the perimeter of at least one female connector, around the perimeter of one or more connected cameras, to the surface of at least one internal component, or combinations thereof;
    curing the first polymer;
    applying the second polymer to at least one internal component; and
    assembling the electronic device, wherein said assembling comprises:
    installing the printed circuit board and battery in a housing;
    connecting the male connectors of the device to base female connectors mounted on the back side of the printed circuit board; and
    applying the first polymer to the side of the connector in an amount sufficient to achieve wicking coverage around perimeter, wherein said first polymer has a hardness greater than said second polymer.

2. The method of claim 1, wherein said first polymer and said second polymer exhibit contact angles of at least 90° after curing.

3. The method of claim 1, wherein said first polymer and said second polymer exhibit contact angles ranging from 100 to 120° after curing.

4. The method of claim 1, wherein the first polymer comprises an acrylic-based polymer comprising fluoroacrylates.

5. The method of claim 1, wherein the second polymer comprises a silicone-based polymer comprising aliphatic polysiloxanes.

6. The method of claim 1, wherein curing the first polymer comprises exposing the polymer to ambient conditions for at least 24 hours.

7. The method of claim 1, wherein curing the second polymer comprises exposing the polymer to ambient conditions for at least 30 minutes.

8. The method of claim 7, wherein curing the second polymer comprises exposing the polymer to a temperature ranging from 90-110° C. for up to 5 minutes.

9. The method of claim 1, wherein in every step, applying the first polymer and the second polymer results in a single layer.

10. The method of claim 9, wherein the thickness of the single layer of the first polymer ranges from 20-1000 nm and the thickness of the single layer of the second polymer ranges from 50-500 nm.

11. The method of claim 1, wherein the first polymer or the second polymer, or both the first and second polymer are applied by at least one automated or manual deposition technique chosen from dipping, spraying, vacuum deposition, and wipe coating.

12. The method of claim 1, wherein said at least one internal component of a device is a power switch, a volume switch, a light, a liquid crystal display, a touch-screen, a touch panel, a camera, an antenna, an internal connector, and combinations thereof.

13. The method of claim 12, wherein the internal connector comprises a printed circuit board, a button, a higher voltage component, and combinations thereof.

14. The method of claim 12, wherein when the internal connector has a male end and a female end, the method comprising applying the multilayered, hydrophobic coating to both the male end and the female end of the connector prior to connecting the male end to the female end.

15. The method of claim 1, wherein the assembled device has improved hydrophobic properties compared to a device without the coated components.

16. The method of claim 1, wherein the electronic device is selected from a group consisting of a cellular phone, a personal digital assistant (PDA), a tablet, a notebook, a laptop, a desktop computer, a music player, a camera, a video recorder, a battery, an electronic reader, a radio device, a gaming device, a server, headphones, terminal blocks, control panels, a wearable device, a medical device, a radio controlled device, an industrial device, and an appliance device.

17. A method of protecting a smart phone from contaminants, comprising:
providing a disassembled smart phone comprising a printed circuit board, a battery and a housing for containing the printed circuit board and battery;
treating, in any order, the backside and front side of the printed circuit board, wherein said treating the backside of the circuit board comprises:
applying an acrylic based polymer around the perimeter of one or more flexible printed circuit (FPC) based female connectors;
applying an acrylic based polymer on at least one or more internal components;
curing the acrylic based polymer;
applying a silicone based polymer on at least one or more internal components located thereon;
wherein said treating the front side of the circuit board comprises:
applying an acrylic based polymer around the perimeter of one or more flexible printed circuit (FPC) based female connectors located thereon;
applying an acrylic based polymer around the perimeter of one or more connected cameras located thereon;
applying an acrylic based polymer on at least one or more internal components located thereon;
curing the acrylic based polymer;
applying a silicone based polymer on at least one or more internal components located thereon;
assembling the electronic device, wherein said assembling comprises:
installing the printed circuit board and battery in said housing;
connecting the male connectors of the device to base female connectors mounted on the back side of the printed circuit board; and
applying the acrylic-based polymer to the side of the connector in an amount sufficient to achieve wicking coverage around perimeter.

18. An electronic device comprising:
a printed circuit board having a front side and a back side, the backside comprising:
at least one female connector having a first polymer located around the perimeter;
at least one internal component having the first polymer located thereon; and;
at least one different internal component having a second polymer located thereon,
the front side of the printed circuit board comprising:
at least one female connector having the first polymer located around the perimeter;
at least one camera having the first polymer located around the perimeter;
at least one internal component having the first polymer located thereon; and;
at least one different internal component having a second polymer located thereon,
the assembled electronic device further comprising the first polymer around perimeter of the housing, wherein the first polymer has a hardness greater than said second polymer.

19. The electronic device of claim 18, wherein said first polymer and said second polymer exhibit contact angles of at least 90° after curing.

20. The electronic device of claim 19, wherein said first polymer and said second polymer exhibit contact angles ranging from 100 to 120° after curing.

21. The electronic device of claim 18, wherein the first polymer comprises a acrylic-based polymer comprising fluoroacrylates.

22. The electronic device of claim 18, wherein the second polymer comprises an silicone-based polymer comprising aliphatic polysiloxanes.

23. The electronic device of claim 18, wherein said one or more component comprises a power switch, a volume switch, a light, a liquid crystal display, a touch-screen, a touch panel, a camera, an antenna, an internal connector, and combinations thereof.

24. The electronic device of claim 23, wherein said internal connector comprises a printed circuit board, a button, a higher voltage component, and combinations thereof.

25. The electronic device of claim 24, wherein said higher voltage component comprises an HDMI component.

26. The electronic device of claim 24, wherein said internal connector has a male end, a female end, or both, and said multilayered, hydrophobic coating is located on both the male end and the female end of the connector.

27. The electronic device of claim 18, wherein said devices comprises a cellular phone, a personal digital assistant (PDA), a tablet, a notebook, a laptop, a desktop computer, a music player, a camera, a video recorder, a battery, an electronic reader, a radio device, a gaming device, a server, headphones, terminal blocks, control panels, a wearable device, a medical device, a radio controlled device, an industrial device, and an appliance device.

28. The electronic device of claim 18, wherein said device exhibits at least ten (10) times greater water resistance in terms of minutes immersed in water compared to the same device not containing said first and second polymers on the printed circuit board.

29. The electronic device of claim 28, wherein said device exhibits at least twenty-five (25) times greater water resistance in terms of minutes immersed in water compared to the same device not containing said first and second polymers on the printed circuit board.

30. The electronic device of claim 29, wherein said device exhibits at least fifty (50) times greater water resistance in terms of minutes immersed in water compared to the same device not containing said first and second polymers on the printed circuit board.

31. The electronic device of claim 18, wherein the thickness of the layer of the first polymer ranges from 20-1000 nm and the thickness of the layer of the second polymer ranges from 50-500 nm.

32. A smart phone having improved hydrophobic properties comprising:
a printed circuit board having a front side and a back side, the backside comprising:
at least one female connector having an acrylic-based polymer located around the perimeter;
at least one internal component having the acrylic-based polymer located thereon; and;
at least one different internal component having a silicone-based polymer located thereon,
the front side of the printed circuit board comprising:
at least one female connector having the acrylic-based polymer located around the perimeter;
at least one camera having the acrylic-based polymer located around the perimeter;
at least one internal component having the acrylic-based polymer located thereon; and;
at least one different internal component having the silicone-based polymer located thereon,
the assembled electronic device further comprising the acrylic-based polymer around perimeter of the housing.

* * * * *